(12) United States Patent
Su (10) Patent No.: US 6,353,997 B1
(45) Date of Patent: Mar. 12, 2002

(54) LAYER BUILD-UP METHOD FOR MANUFACTURING MULTI-LAYER BOARD

(75) Inventor: Yuan-Chang Su, Taoyuan Hsien (TW)

(73) Assignee: Subtron Technology Co., Ltd., Hsinchu (TW)

( * ) Notice: Subject to any disclaimer, the term of this patent is extended or adjusted under 35 U.S.C. 154(b) by 0 days.

(21) Appl. No.: 09/414,007

(22) Filed: Oct. 7, 1999

(51) Int. Cl.⁷ .................................................. H05K 3/36
(52) U.S. Cl. ............................. 29/830; 29/831; 29/846; 29/852; 174/252
(58) Field of Search .......................... 29/831, 851, 852, 29/830, 846; 174/255, 167, 252

(56) References Cited

U.S. PATENT DOCUMENTS

| | | | |
|---|---|---|---|
| 4,285,780 A | * | 8/1981 | Schachter |
| 4,736,521 A | * | 4/1988 | Dohya |
| 4,963,697 A | * | 10/1990 | Peterson et al. |
| 5,146,674 A | * | 9/1992 | Frankeny et al. |
| 5,231,757 A | * | 8/1993 | Chantraine et al. |
| 5,382,757 A | * | 1/1995 | Ishida |
| 6,163,957 A | * | 12/2000 | Jiang et al. |
| 6,165,892 A | * | 12/2000 | Chazen et al. |

* cited by examiner

Primary Examiner—Carl J. Arbes
(74) Attorney, Agent, or Firm—J.C. Patents (57) ABSTRACT

A layer build-up process for forming a multi-layer board. A conductive substrate has a plurality of bumps formed thereon. The space between the bumps is filled with a dielectric material. The conductive substrate and a core substrate having an insulation layer and a first wiring layer on each side of the insulation layer are pressed together such that the bumps are electrically connected to one of the first wiring layer via a joining material. The conductive substrate is next patterned to form a second wiring layer such that the second wiring layer is electrically coupled to one of the first wiring layer via the bumps. The second wiring layer, the bumps and the dielectric material together constitute a composite layer unit. To obtain a multi-layer board, a multiple of the composite layer units can be formed over each side of a substrate core by repeating the above process.

34 Claims, 5 Drawing Sheets

LAYER BUILD-UP METHOD FOR MANUFACTURING MULTI-LAYER BOARD

BACKGROUND OF THE INVENTION

1. Field of the Invention

The present invention relates to a layer build-up method for manufacturing a multi-layer board. More particularly, the present invention relates to a layer build-up method for manufacturing a multi-layer board such that different layers are connected by solid interconnects.

2. Description of the Related Art

Due to ever-increasing consumer demands for higher functionality, lighter weight, and smaller size of electronic products, most electronic products are designed in this direction. The outcome of this trend is a continuous increase in the level of integration of the integrated circuits. To decrease the volume of a chip package, the number of layers in a chip-mounting substrate board has to increase. A multi-layer substrate board is indispensable, especially for a package having a highly integrated chip or a multi-chip module with several chips inside.

The different layers on a multi-layer substrate board must somehow be connected. Conventionally, different layers are connected by forming plated through holes (PTH). The plated through holes are formed by drilling a set of through holes in the substrate board, and chemically or electrically coating the holes with a metallic layer chemically or electrically. However, drilling holes in the multi-layer board to form the plated through holes often destroys the integrity of the voltage layer, leading to capacitance loss and an increase in electrical noise. In addition, the holes occupy a large portion of the usable area and hinder wiring layout. Therefore, industry has gradually adopted a layer build-up method for forming a multi-layer board. The board is formed by sequential lamination using blind vias to connect neighboring layers. A blind via is formed by drilling a hole through one layer to its adjacent layer, only. A layer of copper is plated, and finally filler material or conductive material such as copper or silver paste is used to fill the hole. Using blind vias to connect sequentially laminated layers greatly reduces area needed for interconnects and the voltage layer within the multi-layer board can have better integrity.

Although sequential lamination is able to reduce area occupation of interconnects, adjacent wiring layers are actually connected through a thin coat of copper lining the blind via. Thus, inter-layer impedance is increased and the overall electrical properties of the multi-layer board may be affected. Furthermore, conventional sequential lamination processes for forming a multi-layer board rely on attaching a copper foil to the board before drilling a hole. However, the filler material has minimal resistance against laser drilling, mechanical drilling or etching operation, and thus cannot serve as a stopping layer. Therefore, the vias in each layer must be alternately distributed just to prevent holes from drilling into an underlying wiring layer. If filler materials such as copper or silver paste are used inside the blind vias, electrical conductivity between layers may improve. However, both copper paste and silver paste are expensive materials. In addition, the paste may not fill the blind vias entirely, and electrical conductivity may not improve that much.

Figure 1A:
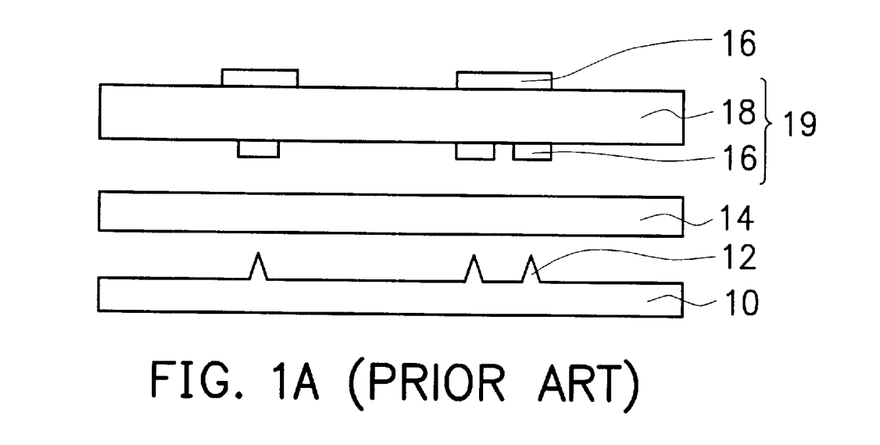
FIGS. 1A through 1C are schematic cross-sectional views showing the progression of manufacturing steps for producing a multi-layer board using a layer build-up process developed by Toshiba.
Figure 1B:
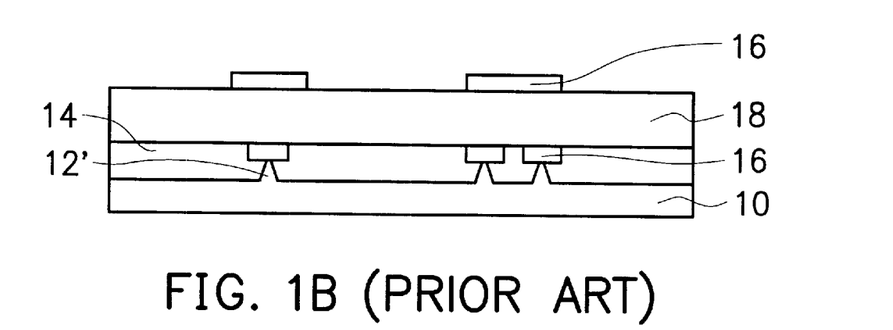
Figure 1C:
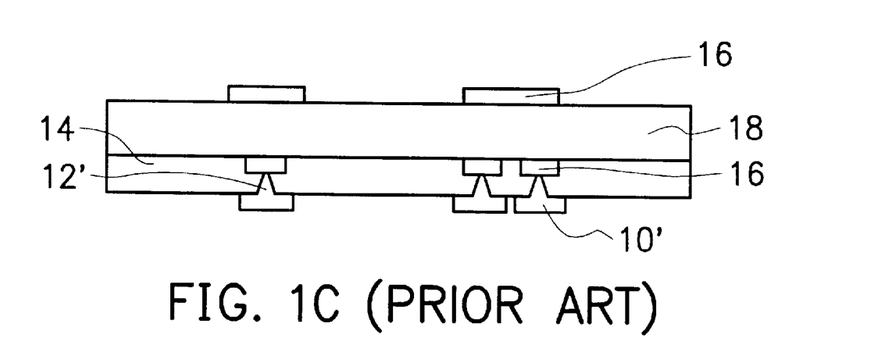

FIGS. 1A through 1C are schematic cross-sectional views showing the progression of manufacturing steps for producing a multi-layer board using a layer build-up process developed by Toshiba. The method is called a buried bump interconnect technology (BBIT). As shown in FIG. 1A, solid conical bumps 12 are formed on a copper foiled substrate 10 in places wherein contact circuits 16 are desired. The solid conical bumps 12 on the substrate 10 are formed by smearing silver paste on a metallic mold plate and pressing on the substrate 10. External profile, height and hardness of each bump must be meticulously controlled. The copper-foiled substrate 10, a non-knitted dielectric layer 14 and core substrate 19 having an inner dielectric layer 18 and an outer conductive layer 16 are pressed together to form a structure shown in FIG. 1B. Because the conical bumps 12 are relatively hard, the pointed edge of each bump 12 is able to pierce through the dielectric layer 14 and contact a circuit line 16. When the conical bumps 12 pierce through the dielectric layer 14 and hit upon the conductive layer 16, the conical bumps 12 are forged into bowl bumps 12'. In the last stage, the copper-foiled substrate 10 is patterned to form a conductive layer as shown in FIG. 1C. The entire process can be repeated several times to obtain a multi-layer board.

Since solid bumps instead of hollow blind vias are formed inside the aforementioned multi-layer board, electrical characteristics of the board are improved. However, hardness and external profile of each conical bump 12 has to be carefully controlled in order to have proper contact with the conductive layer 16. Moreover, the metallic mold plate and the silver paste are expensive, and costly equipment has to be used in the process.

SUMMARY OF THE INVENTION

Accordingly, one object of the present invention is to provide a layer build-up process for forming a multi-layer board that uses fewer steps and less expensive equipment.

A second object of the invention is to provide a layer build-up process for forming a multi-layer board capable of having a plurality of solid interconnects all stacked upon each other. Consequently, circuit paths are shorter and reactance is smaller. In addition, wiring area can be smaller.

To achieve these and other advantages and in accordance with the purpose of the invention, as embodied and broadly described herein, the invention provides a layer build-up process for forming a multi-layer board. A conductive substrate is provided. Bumps are formed on the conductive substrate by half-etching. A dielectric layer is formed, filling the space between the bumps. The dielectric layer can be formed by drilling a series of holes that correspond in position to the bumps on a plastic (pre-preg) plate, and then pressing together the plastic plate and the conductive substrate. Alternatively, the dielectric layer can be formed by screen-printing, dispensing, or coating a photosensitive polymer followed by a photolithographic process.

Another half-etching operation is carried out to remove a portion of the bumps so that the top surface of each bump is at a level lower than the top surface of the dielectric layer. A layer of conductive plastic or solder paste is smeared on top of the bumps. The conductive substrate with the dielectric layer and a core substrate are stacked together. The core substrate has a multi-layer structure that includes a plurality of alternately placed insulation layers and wiring layers. When the conductive substrate with the dielectric layer and the core substrate are pressed together, bumps on the conductive substrate touch corresponding contact points on wiring layer. Hence, the conductive substrate and the wiring layer are electrically connected. Heat is next applied to make the dielectric material fluidic so that the space between the conductive substrate and the wiring layer is filled. After cooling, the conductive substrate and the wiring layer are interlocked together by the solidified dielectric material. Using photolithographic and etching processes, the conductive substrate is patterned to form a second wiring layer. The second wiring layer, the bumps and the dielectric layer together constitute a composite layer. The aforementioned steps can be repeated to form a multi-layer board that includes a stack of these composite layers over a core substrate.

The layer build-up process of this invention uses solid bumps as interconnects between different wiring layers. Hence, no filler material is required to fill interconnects and the fabricated multi-level board has better electrical properties. In addition, the bumps in the dielectric layer can stack on top of each other. Without the alternation of layers, wiring area is reduced and circuit paths are shortened. Consequently, circuit reactance is lowered. Furthermore, by using an etching method to form the bumps, processing steps are simpler, control is easier and equipment cost is lower.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2G are schematic cross-sectional views showing the progression of manufacturing steps for producing a multi-layer board using a layer build-up process according to this invention.

Figure 2A:
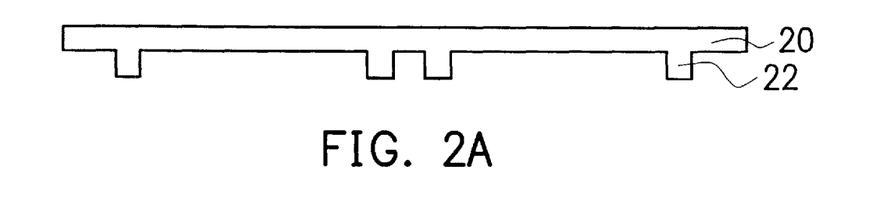
FIGS. 2A through 2H are schematic cross-sectional views showing the progression of manufacturing steps for producing a multi-layer board using a layer build-up process according to this invention.
Figure 3:
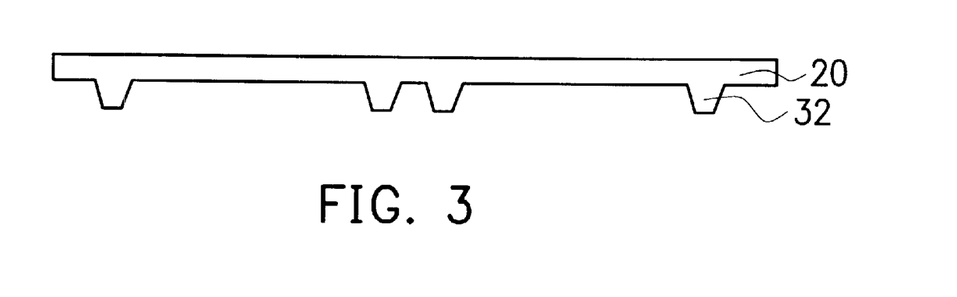
FIG. 3 is a schematic cross-sectional view showing a second type of bumps on a conductive substrate according to this invention.

As shown in FIG. 2A, a conductive substrate 20 for forming a wiring layer is provided. A portion of the conductive substrate 20 is removed to form a plurality of bumps 22 by half-etching. The conductive substrate 20 can be etched, for example, by dry etching or wet etching. In general, the conductive substrate 20 is a copper foil having a thickness of between about 5 to 6 mils ($10^{-3}$ inch). In this invention, the conductive substrate 20 is etched in a wet etching operation. Besides cylindrical bumps 22, bowl bumps 32 (as shown in FIG. 3) or bit bumps 33 (as shown in FIG. 4A) can also be formed on the conductive substrate 20.

Figure 5:
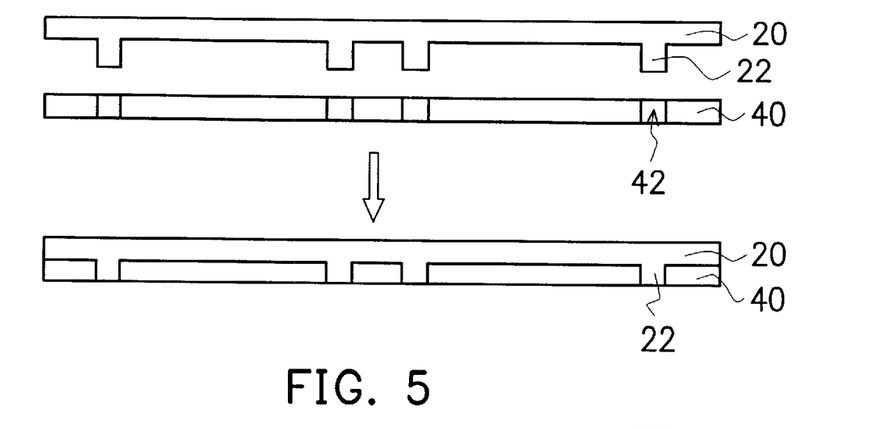
FIG. 5 is a schematic cross-sectional view illustrating an alternative process of forming the structure in FIG. 2B.

A dielectric material is next deposited to form a dielectric layer 24 that fills the space between the bumps 22 while exposing a top surface of the bumps 22. Several methods are available to form the dielectric layer 24. In FIG. 5, a plastic plate 40 (pre-preg) forms the base of the dielectric layer 24. The plastic plate 40 is drilled to form holes 42 that correspond in position to the bumps 22. The plastic plate 40 and the conductive substrate 20 are combined by pressing them together. The holes 42 in the plastic plate 40 can be formed by mechanical drilling or laser burning. Obviously, when the conductive substrate has bowl bumps 32 (as shown in FIG. 3), it is easier for the bumps 32 to enter the holes 42 in the plastic plate 40.

Figure 4A:
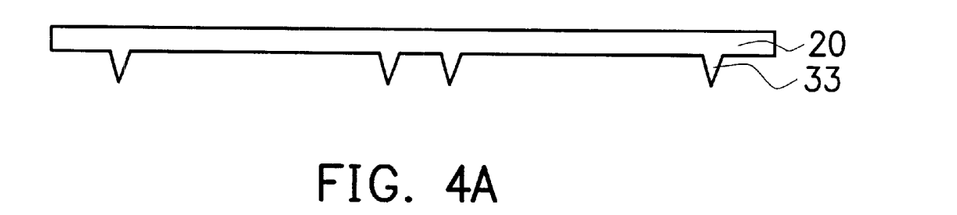
FIG. 4A is a schematic cross-sectional view showing a third type of bumps on a conductive substrate according to this invention.
Figure 4B:
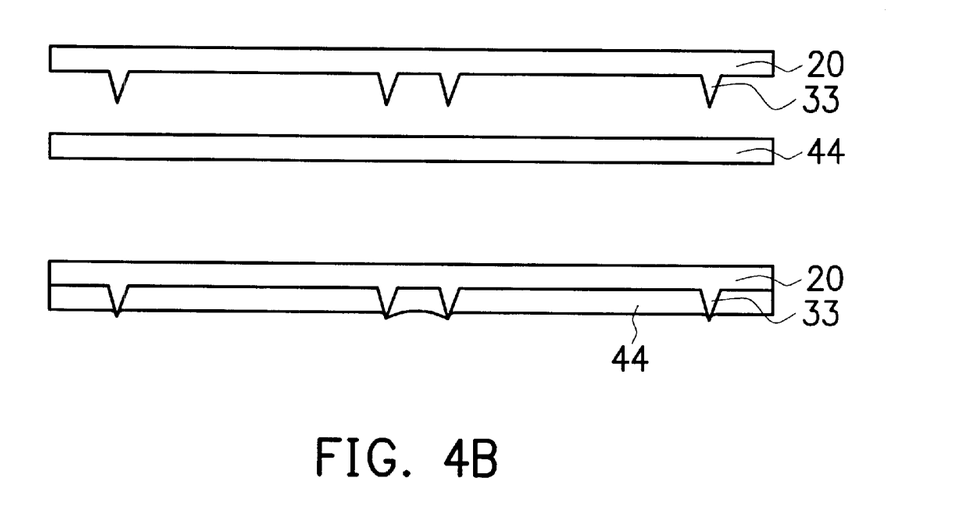
FIG. 4B is a schematic cross-sectional view illustrating an alternative process of forming the structure in FIG. 2B.

If the conductive substrate 20 has conical bumps 33 (as shown in FIG. 4A), a dielectric layer 24 made from non-woven plastic 44 can be employed as shown in FIG. 4B. The plastic plate 44 and the conductive substrate 20 with the bit bumps 33 are pressed together directly so that the tips of the bumps 33 pierce through the plastic plate 44.

Figure 2B:
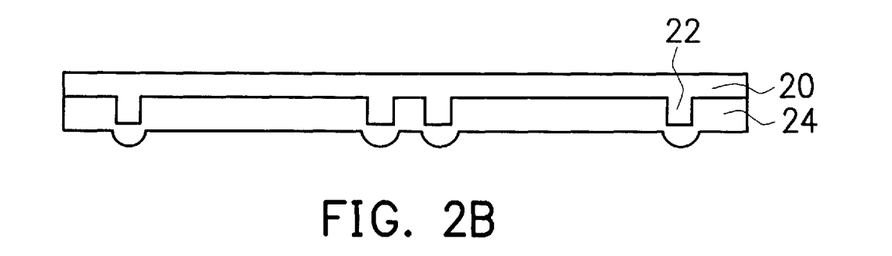

In FIG. 2B, a coating method is used to form a dielectric layer 24 over the conductive substrate 20. For example, using a screen printer, dielectric material 24 is deposited so that the space between the bumps 22 is filled in a single operation. Alternatively, a dispenser can be used to deposit dielectric material between the bumps 22 from one location to another. A third alternative is to deposit a photosensitive polymer over a dielectric layer 24 on the conductive substrate 20, and then perform photolithographic and etching processes to remove a portion of the dielectric layer 24 so that the bumps 22 are exposed. When the dielectric layer 24 is formed by coating, a pre-heating treatment is usually required for preliminary solidification. The pre-heating treatment, preferably carried out at a temperature of about 80 to 90° C., removes a portion of the solvents within the dielectric material 24 so that a B-stage dryness is maintained.

Figure 2C:
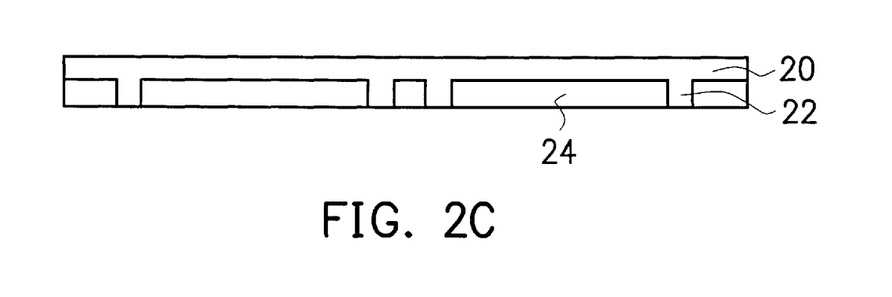

As shown in FIG. 2C, a grinding step is performed to remove the dielectric layer above the bumps 22. The surface of the dielectric layer is flat after performing the grinding step. The surfaces of the bumps 22 are exposed.

Figure 2D:
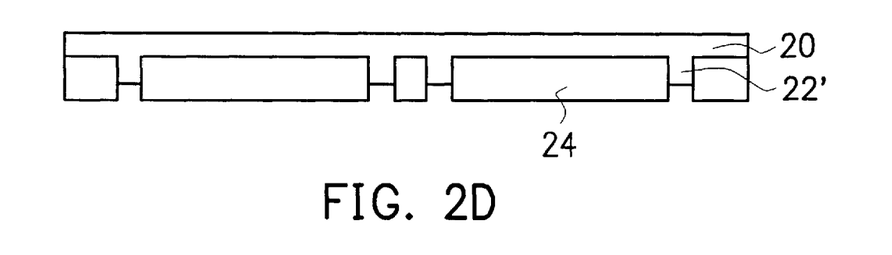

As shown in FIG. 2D, a half-etching step is performed on the bumps 22 to form shorter bumps 22'. The purpose of the half-etching step is to decrease the thicknesses of the bumps 22. The top surface of the bumps 22' is at a level below the top surface of the dielectric layer 24.

Figure 2E:
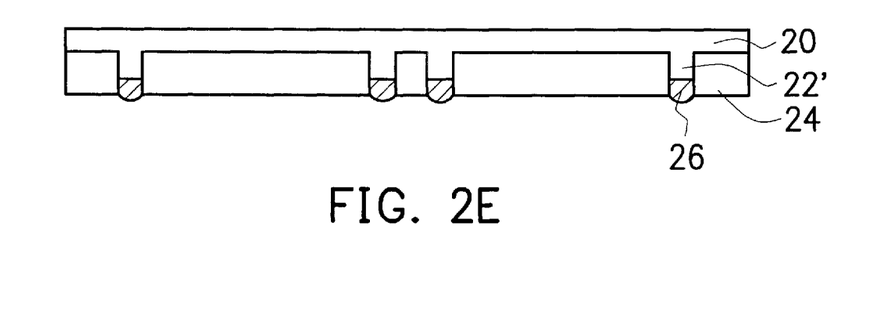

As shown in FIG. 2E, joining material 26 is dropped onto the top surface of every bump 22'. The joining material 26 can be solder paste or conductive plastic.

Figure 2F:
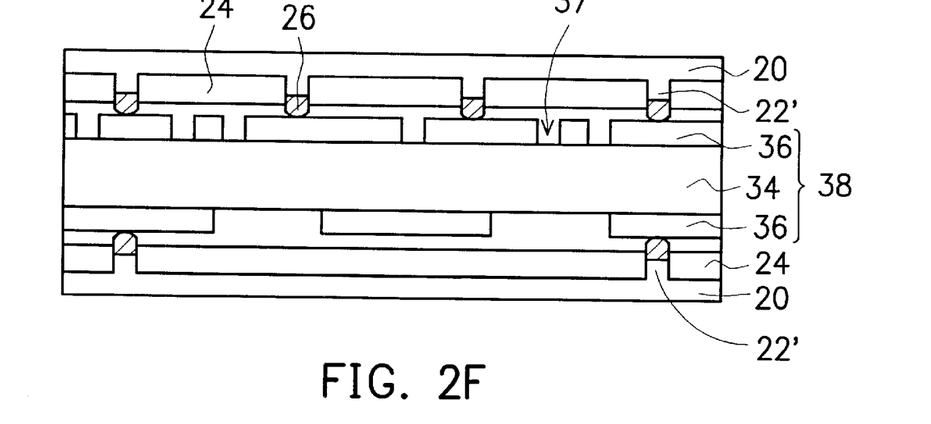
Figure 6:
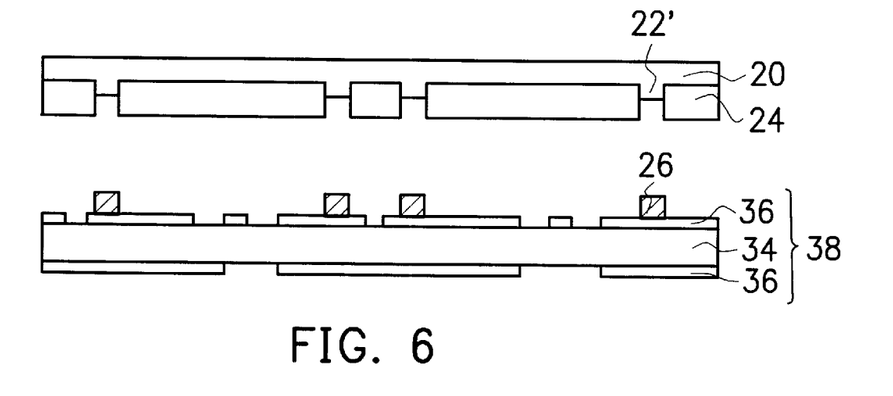
FIG. 6 is a schematic cross-sectional view illustrating an alternative process to the steps carried out in FIGS. 2D and 2E.

As shown in FIG. 2F, the conductive substrate 20 with the dielectric layer 24 can be attached to a core substrate 38. The core substrate 38 can be, for example, a double-sided board composed of an insulation layer 34 sandwiched between two wiring layers 36. To form a four-layered board, all that is required is to attach a conductive substrate 20 over each wiring layers 36 of the core substrate 38. Obviously, the bumps 22' on each conductive substrate 20 must face the wiring layer 36 when attached to the core substrate 38. FIG. 6 is a schematic cross-sectional view illustrating an alternative process to the steps carried out in FIGS. 2D and 2E. Instead of being placed on the top surface of the bumps 22, some joining material 26 is directly deposited on the surface of the wiring layer 36 in positions that corresponds to the bumps 22. The conductive substrate 20 and the core substrate 38 are next joined together so that the bumps are electrically coupled to the wiring layer 36 by means of the joining material 26.

Figure 2G:
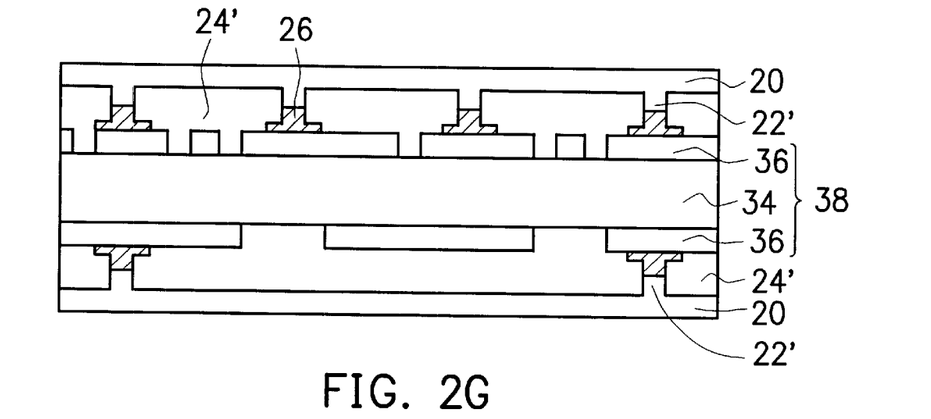

As shown in FIG. 2G, the conductive substrate 20 and the core substrate 38 are pressed together. At the same time, a post-heating and pressing treatment is performed. The post-heating treatment serves to make the partially solidified dielectric material 24 fluidic so that the gaps (such as 37 in FIG. 2F) in the wiring layer 36 are filled. In addition, the dielectric material is solidified into C-stage dryness or complete solidification. After the post-heating treatment, almost all the solvents within the dielectric material 24 are vaporized away. Moreover, some of the dielectric material 24 leaks into the space 37 within the wiring layer 36 so that cohesion of the conductive substrate 20 with the core substrate 38 improves.

Figure 2H:
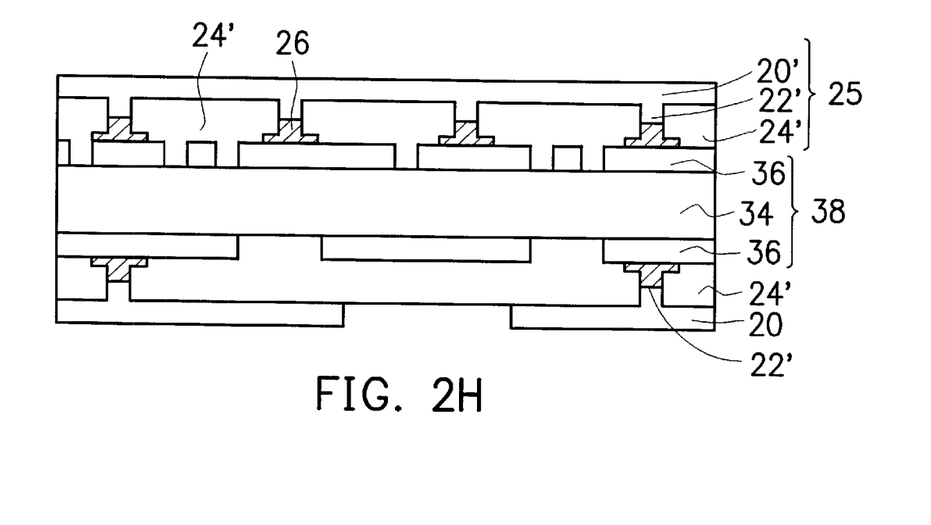
Figure 7:
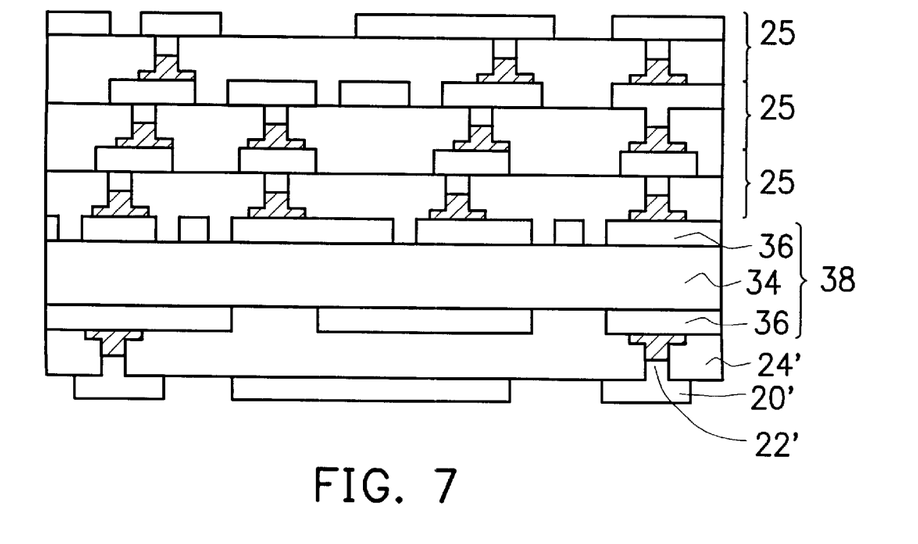
FIG. 7 is a schematic cross-sectional view of a multi-layer board fabricated according to the layer build-up process of this invention.

As shown in FIG. 2H, the conductive substrate 20 is patterned to form another wiring layer 20' on the dielectric layer 24 by etching or some other method. The wiring layer 20', the bumps 22' and the dielectric layer 24 together constitute a composite layer unit 25. FIG. 7 is a schematic cross-sectional view of a multi-layer board fabricated according to the layer build-up process of this invention. To form the layered structure in FIG. 7, the board structure as shown in FIG. 2G can be used as a core substrate for repeating the steps depicted in FIGS. 2A through 2H. By stacking a plurality of the composite layer units 25 over a core substrate 38, a multi-layer board of this invention is formed.

In general, the conventional layer build-up process requires the service of a high precision drilling machine such as a carbon dioxide laser or a neodymium:yttrium aluminum garnet laser to form the blind vias and environmentally polluting as well as expensive electroplating machines to coat the blind vias. Since no blind vias are formed in the multi-layer board of this invention, rather inexpensive machines such as mechanical drilling station and an ordinary etching machine are needed. Hence, the processing setup of this invention is simpler and easier to control, and production cost is lowered. Furthermore, since solid bumps are used as interconnects between different wiring layers, reactance is lower. Therefore, the multi-layered board of this invention will have better electrical properties. Moreover, holes are drilled in the dielectric layer instead on the multi-layer board. Hence, the bumps can be stacked vertically on top of each other (as shown in FIG. 7). Because alternate layering of the bumps between layers is unnecessary, wiring area can be reduced and circuit path can be shortened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layer build-up process for forming a multi-layer board, comprising the steps of:

providing a conductive substrate;

half-etching a portion of the conductive substrate to form a plurality of bumps;

filling the space between the bumps with a dielectric material such that only top surfaces of the bumps are exposed;

half-etching the bumps to reduce their height so that the top surfaces of the bumps is at a level below a top surface of the dielectric layer;

applying joining material to the top surface of each bump;

providing a core substrate having one or more insulation layers and a plurality of first wiring layers with each insulation layer sandwiched between two neighboring wiring layers;

pressing the conductive substrate and the core substrate together such that the bumps on the conductive substrate are electrically connected to the first wiring layer through the joining material; and patterning the conductive substrate to form a second wiring layer such that the second wiring layer is electrically connected to the first wiring layer through the bumps, wherein the second conductive layer, the bumps and the dielectric material layer together constitute a composite layer unit.

2. The process of claim 1, wherein the process further includes repeating the steps in claim 1 to form a stack of composite layer units over the core substrate.

3. The process of claim 1, wherein the bumps are cylindrical-shaped.

4. The process of claim 1, wherein the bumps are conical-shaped.

5. The process of claim 1, wherein the bumps are bowl-shaped.

6. The process of claim 1, wherein the dielectric material layer includes a plastic plate, and the step of filling the space between the bumps includes the substeps of:

providing a plastic plate with a plurality of holes in positions that correspond to positions of bumps on the conductive substrate; and pressing the plastic plate and the conductive substrate together so that the bumps fit into the holes.

7. The process of claim 4, wherein the dielectric material layer includes a plastic plate, and the step of filling the space between the bumps includes pressing the plastic plate and the conductive substrate together so that the conical bumps pierce through the plastic plate such that the tips of the bumps are exposed.

8. The process of claim 1, wherein the step of filling the space between the bumps further includes coating a dielectric material over the conductive substrate by a screen-printing method.

9. The process of claim 1, wherein the step of filling the space between the bumps further includes dispensing dielectric material with a dispenser.

10. The process of claim 1, wherein the dielectric material layer includes a photosensitive polymer, and the step of filling the space between the bumps includes the substeps of:

coating the photosensitive polymer over the conductive substrate surface; and performing a photolithographic process to remove a portion of the photosensitive polymer so that the top surfaces of the bumps are exposed.

11. The process of claim 6, wherein after the step of pressing the conductive substrate and the core substrate together, further includes heating the plastic plate so that the plastic becomes fluidic and fills the gaps between the conductive substrate and the core substrate.

12. The process of claim 7, wherein after the step of pressing the conductive substrate and the core substrate together, further includes heating the plastic plate so that the plastic becomes fluidic and fills the gaps between the conductive substrate and the core substrate.

13. The process of claim 8, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills the gaps between the conductive substrate and the core substrate.

14. The process of claim 9, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills the gaps between the conductive substrate and the core substrate.

15. The process of claim 10, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills the gaps between the conductive substrate and the core substrate.

16. The process of claim 1, wherein the joining material is solder paste.

17. The process of claim 1, wherein the joining material is conductive plastic.

18. A layer build-up process for forming a multi-layer board, comprising the steps of:
 providing a conductive substrate;
 half-etching a portion of the conductive substrate to form a plurality of bumps;
 filling the space between the bumps with a dielectric material such that only top surfaces of the bumps are exposed;
 half-etching the bumps to reduce their height so that the top surface of the bumps is at a level below a top surface of the dielectric layer;
 providing a core substrate having one or more insulation layers and a plurality of a first wiring layers with each insulation layer sandwiched between two neighboring wiring layers;
 applying some joining material on a surface of the first wiring layer in positions that correspond to the bumps on the conductive substrate;
 pressing the conductive substrate and the core substrate together such that the bumps on the conductive substrate are electrically connected to the first wiring layer through the joining material; and
 patterning the conductive substrate to form a second wiring layer such that the second wiring layer is electrically connected to the first wiring layer through the bumps, wherein the second conductive layer, the bumps and the dielectric material layer together constitute a composite layer unit.

19. The process of claim 18, wherein the process further includes repeating the steps in claim 15 to form a stack of composite layer units over the core substrate.

20. The process of claim 18, wherein the bumps are cylindrical-shaped.

21. The process of claim 18, wherein the bumps are conical-shaped.

22. The process of claim 18, wherein the bumps are bowl-shaped.

23. The process of claim 18, wherein the dielectric material layer includes a plastic plate, and the step of filling the space between the bumps includes the substeps of:
 providing a plastic plate with a plurality of holes in positions that correspond to positions of bumps on the conductive substrate; and
 pressing the plastic plate and the conductive substrate together so that the bumps fit into the holes.

24. The process of claim 21, wherein the dielectric material layer includes a plastic plate, and the step of filling the space between the bumps includes pressing the plastic plate and the conductive substrate together so that the conical bumps pierce through the plastic plate such that tips of the bumps are exposed.

25. The process of claim 18, wherein the step of filling the space between the bumps further includes coating a dielectric material over the conductive substrate by a screen-printing method.

26. The process of claim 18, wherein the step of filling the space between the bumps further includes dispensing dielectric material with a dispenser.

27. The process of claim 18, wherein the dielectric material layer includes a photosensitive polymer, and the step of filling the space between the bumps includes the substeps of:
 coating the photosensitive polymer over the conductive substrate surface; and
 performing a photolithographic process to remove a portion of the photosensitive polymer so that the top surfaces of the bumps are exposed.

28. The process of claim 23, wherein after the step of pressing the conductive substrate and the core substrate together, further includes heating the plastic plate so that the plastic becomes fluidic and fills gaps between the conductive substrate and the core substrate.

29. The process of claim 24, wherein after the step of pressing the conductive substrate and the core substrate together, further includes heating the plastic plate so that the plastic becomes fluidic and fills gaps between the conductive substrate and the core substrate.

30. The process of claim 25, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills gaps between the conductive substrate and the core substrate.

31. The process of claim 26, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills gaps between the conductive substrate and the core substrate.

32. The process of claim 27, wherein after the step of filling the space between the bumps with a dielectric material, further includes performing a pre-heating treatment of the dielectric material, and after the step of pressing the conductive substrate and the core substrate together, further includes performing a post-heating treatment of the dielectric material so that the plastic becomes fluidic and fills gaps between the conductive substrate and the core substrate.

33. The process of claim 18, wherein the joining material is solder paste.

34. The process of claim 18, wherein the joining material is conductive plastic.

* * * * *